(12) United States Patent
Reid et al.

(10) Patent No.: US 7,331,528 B2
(45) Date of Patent: Feb. 19, 2008

(54) SMARTCARD AND METHOD FOR PRODUCTION OF A SMARTCARD

(75) Inventors: Michael Reid, Kulz (DE); Anton Brunner, Kötzting (DE)

(73) Assignee: Muehlbauer AG, Roding (DE)

( * ) Notice: Subject to any disclaimer, the term of this patent is extended or adjusted under 35 U.S.C. 154(b) by 250 days.

(21) Appl. No.: 10/537,386

(22) PCT Filed: Dec. 2, 2003

(86) PCT No.: PCT/EP03/13552

§ 371 (c)(1),
(2), (4) Date: Jun. 3, 2005

(87) PCT Pub. No.: WO2004/051559

PCT Pub. Date: Jun. 17, 2004

(65) Prior Publication Data
US 2006/0038022 A1   Feb. 23, 2006

(30) Foreign Application Priority Data
Dec. 5, 2002 (DE) .............................. 102 57 111

(51) Int. Cl.
G06K 19/06 (2006.01)
(52) U.S. Cl. .................................... 235/492
(58) Field of Classification Search ............... 235/492, 235/451, 488; 361/736, 737; 343/866, 873
See application file for complete search history.

(56) References Cited

U.S. PATENT DOCUMENTS

| | | | |
|---|---|---|---|
| 5,519,201 A | 5/1996 | Templeton, Jr. et al. | 235/492 |
| 6,161,761 A * | 12/2000 | Ghaem et al. | 235/492 |
| 6,174,113 B1 * | 1/2001 | Brechignac et al. | 409/132 |
| 6,301,119 B1 | 10/2001 | Thevenot et al. | 361/737 |
| 6,467,692 B1 * | 10/2002 | Tarantino et al. | 235/492 |
| 6,514,367 B1 * | 2/2003 | Leighton | 156/153 |
| 6,677,186 B1 * | 1/2004 | Zafrany et al. | 438/125 |
| 2002/0053598 A1 * | 5/2002 | Kobayashi et al. | 235/492 |

FOREIGN PATENT DOCUMENTS

| | | |
|---|---|---|
| DE | 19500925 | 7/1996 |
| DE | 69218128 T | 10/1997 |
| DE | 19703990 | 8/1998 |
| DE | 19747388 | 5/1999 |
| DE | 19749650 | 5/1999 |
| DE | 10108930 | 9/2002 |
| DE | 10117754 | 9/2002 |
| EP | 0545568 | 6/1993 |

* cited by examiner

Primary Examiner—Ahshik Kim
(74) Attorney, Agent, or Firm—Needle & Rosenberg, P.C.

(57) ABSTRACT

The invention relates to a smart card and also to a method of producing such a smart card having a card body (11), at least one recess (12a, 12b) arranged therein for receiving at least one chip module (16) having module connections (17) in the edge region (16a) of the chip module (16) and a conductive structure body embedded in the card body (11) and having body contact connections (13), in particular an antenna having antenna connections which are arranged below the edge region (16a) of the chip module (16), where, with the chip module (16) installed between the module connections (17) on the one hand and the body contact connections (13) on the other hand, adhesive parts (14) preferably applied at points and made of elastic, conductive material are arranged between the connections (13, 17) with pressure being applied to produce a contact.

8 Claims, 2 Drawing Sheets

SMARTCARD AND METHOD FOR PRODUCTION OF A SMARTCARD

CROSS REFERENCE TO RELATED APPLICATIONS

The present application claims priority to German Application No. 102 54 111.2, filed Dec. 5, 2002, which application is incorporated herein fully by this reference.

BACKGROUND OF THE INVENTION

The invention relates to a smart card and also to a method of producing such a smart card having a card body and at least one recess arranged therein for receiving at least one chip module having module connections in the edge region of the chip module and a conductive structure body embedded in the card body and having body contact connections, in particular an antenna having antenna connections which are arranged below the edge region of the chip module, according to the preambles of patent Claims 1 and 7.

Such smart cards are generally designed as credit cards, bank cards, electronic wallets, etc. and are used to make transactions without using cash, such as for example to pay transport costs on public transport or to pay a purchase price for goods or services. Furthermore, such a smart card can also be used as an ID card for a contactless access control system.

Smart cards usually have a recess for receiving a chip module which comprises an integrated circuit for storing, processing and/or recognizing information that is exchanged with a device, with the smart card either being inserted into the device or brought into the vicinity thereof.

In addition, contactless smart cards for power and data transmission at relatively low frequencies comprise antennas which are generally laminated into the card body and the antenna connections of which must be electrically connected to module connections of the chip module that is inserted.

Conventionally, there are two methods that are frequently used to produce conductive contacts between module connections and antenna connections lying therebelow in the case of methods for producing dual interface cards. In the so-called ACF method, a hot-melt or thermoplastic adhesive with conductive particles arranged therein is arranged so as to produce an electrical connection between contact connections arranged on the underside of the module and laterally protruding antenna connections arranged therebelow, in which the adhesive is applied to a surface of the card body in the region of the recess into which the chip module is inserted. Following installation of the chip module, the conductive particles produce an electrical contact between the module connections and the antenna connections lying therebelow. For this, the hot-melt or thermoplastic adhesive is heated and cured after it has been applied and following installation of the chip module, taking account of specific values for the parameters of temperature, pressure and duration. Such a method is illustrated for example in DE 197 09 985 A1.

In the event of frequent bending stresses, such cured hot-melt and thermoplastic adhesives, which at the same time produce a mechanical connection between chip module and card body, result in a loosening of the electrical connections on account of the plastic and elastic deformability properties of the hot-melt and thermoplastic adhesives. The result is an electronically unreliable connection in the smart card, which for example is of the dual interface type.

DE 197 47 388 C1 discloses another method for the electrical connection of antenna connections and chip module connections using a conductive liquid adhesive. In a recess (cavity) within the card body that is provided for receiving the chip module, at least one bore is made from an edge adhesive region, provided for the adhesion of the chip module, to the antenna connections lying therebelow, in order to introduce into said bore, in a metered manner, a conductive liquid adhesive. Following such a metering, the chip module is placed directly thereon using an adhesive applied to the adhesive region. The adhesive is cured at a predetermined temperature by the action of heat or, if two-component adhesives are used, by exothermic reactions. On account of its stiff and hard properties and also different adhesion properties with respect to the parts that are to be connected, such adhesives frequently exhibit, in the event of frequently occurring dynamic loads as may arise as a result of the smart card being wrongly pushed into a cash machine or as a result of the smart cards being kept in a wallet that is designed to be flexible per se, breaks in the cohesion and/or adhesion in the adhesive on account of overstretching and fatigue phenomena.

Accordingly, it is an object of the present invention to provide a smart card having an inserted chip module and a conductive structure body, such as an antenna, integrated in the smart card, which ensures a permanent electrical connection between chip module connections and body contact connections even in the event of high and frequent bending stress, and also to provide a method of producing such a smart card.

This object is achieved by a smart card having the features of patent Claim 1 and by a production method having the features of patent Claim 7.

An essential point of the invention is that, in a smart card having a card body, at least one recess arranged therein for receiving at least one chip module having module connections in the edge region of the chip module and a conductive structure body embedded in the card body, such as an antenna having antenna connections which are arranged below the edge region of the chip module, with the chip module installed between the module connections on the one hand and the body contact connections on the other hand, adhesive parts made of elastic, conductive material are arranged between the connections with pressure being applied to produce a contact. Such adhesive parts are preferably applied at points to the body contact connections or the module connections and cured prior to installation of the chip module. The chip module is then installed in the card body, as a result of which the adhesive parts are pressed together as a resilient buffer between the connections and produce a permanent, flexible, electrical contact between the module connections and the body contact connections on account of their elastic properties.

BRIEF SUMMARY OF THE INVENTION

By using a highly filled silicone-based adhesive that is preferably liquid at the start and is subsequently solidified prior to installation of the chip module, an electrically conductive bump is obtained following installation of the chip module, which bump, even in the event of high and frequent bending stress of the smart card, neither exhibits tears nor allows an interspace to develop between the adhesive parts and the module connections or body contact connections.

Preferably, the adhesive parts are arranged within cutouts which are arranged in the card body below the edge region of the chip module and at the bottom terminate with the body contact connections. Such cutouts have a volume size that is sufficient to completely receive the adhesive parts under the application of pressure.

In the direction of the card body thickness, the height dimensions of the cutouts are smaller than the height of the applied adhesive parts, without the application of pressure, that is to say prior to installation of the chip module. The applied adhesive parts are preferably 0.05-0.15 mm higher than upper edge regions of the cutouts in which the adhesive parts are arranged.

According to the method of producing smart cards, the adhesive is preferably first inserted into the cutouts in drop form and then one waits for it to solidify. This is effected by means of a special machine developed for this purpose, which first dispenses the drop of adhesive in the µl order of magnitude and then removes itself from the drop via a rapid pull-off movement in order to avoid so-called drop noses. In this way, hemispherical surfaces of the drop of adhesive are advantageously obtained, and these are critical for the elastic action of such a bump.

In order to obtain information about the quality of the shape of the hemispherical surface, a measurement of the surface structure is then carried out using a laser beam device which takes reflection measurements at the hemispherical surface and the surface structure surrounding the latter.

Following the application of such a drop-shaped adhesive part, stacking of the individual smart cards takes place for about 2-3 hours in order for the adhesive parts to cure. The chip modules are then implanted into the smart cards which are taken individually from the stack. The cured adhesive parts act as flexible bumps which ensure contact between the connections even in the event of bending of the smart card.

Following installation of the chip module, the adhesive parts are pressed downwards by the module connections of the chip module and thereby undergo expansion in the longitudinal and width directions of the smart card. As soon as the module connections have been placed on the upper edge region of the cutouts, virtually the entire volume size of the cutouts is filled with the pressed-together adhesive parts. In this way, further expansion of the adhesive parts is avoided even in the event of many years' use of the smart card, as a result of which the formation of interspaces between the module connections or body contact connections and the adhesive parts made of elastic material can be avoided.

Further advantageous embodiments emerge from the subclaims.

BRIEF DESCRIPTION OF THE SEVERAL VIEWS OF THE DRAWINGS

Advantages and expediencies can be gathered from the following description in conjunction with the drawing, in which.

DETAILED DESCRIPTION OF THE INVENTION

Figure 1:
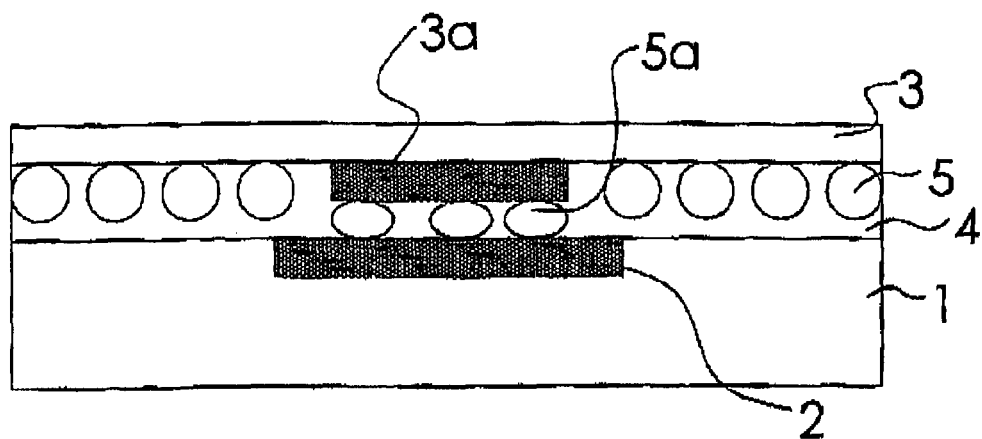
FIG. 1 shows a cross-sectional view of a detail of a smart card according to the prior art.

FIG. 1 shows a cross-sectional view of a detail of a smart card according to the prior art, in which according to the abovementioned ACF method a card body 1, in which there is arranged a conductive structure body, such as an antenna having antenna connections 2, is connected to a chip module 3 by means of a hot-melt adhesive. The chip module 3 on its underside has module connections 3a which must be electrically connected to the antenna connections 2 following installation of the chip module.

In order to electrically connect the connections 2 and 3a, conductive particles in the form of silvered glass beads 5 having a diameter of about 50 µm are arranged in the hot-melt adhesive 4, which conductive particles bring about contacting of the connections in the intermediate region between the connections 2 and 3a, as is shown by reference 5a.

After bending and torsion tests have been carried out, such smart cards produced according to the ACF method exhibit a considerable loss of quality in respect of the electrical connection between the connections 2 and 3a, even at a bending stress of 750 to 1000 bends.

Figure 2:
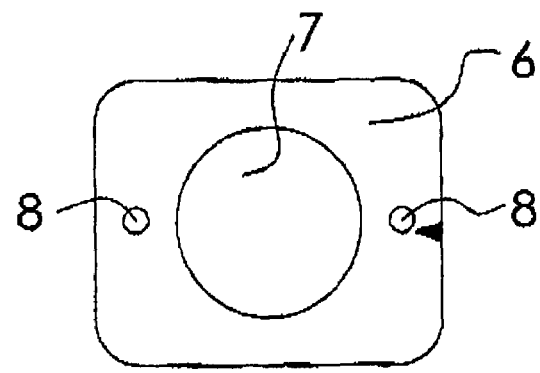
FIG. 2 shows a plan view of a recess for receiving a chip module of a smart card according to the prior art.

FIG. 2 shows a plan view of a recess (cavity) that is arranged within a card body (not shown here) and is designed to receive a chip module, as is known from the prior art. The recess consists of an adhesive area 6 for adhesively bonding the chip module to the card body and of an area 7 that lies somewhat deeper and provides enough free space for the underside of a chip module. In this way, the chip module is mounted in a "floating" manner, so to speak, in the card body, to which it is fixedly connected only in its edge region.

Additional bores 8 are arranged in a downwardly running manner from the adhesive area 6 towards the antenna connections lying therebelow, in order to arrange conductive liquid adhesive therein. Following the metering of the adhesive into the bores 8, the chip module is immediately placed on the adhesive area 6 and curing of the adhesive used is brought about by the action of heat.

By virtue of the conductive adhesive in the bores 8, there is an electrical connection between the antenna connections (not shown here) and the module connections of the inserted chip module that lie thereabove (not shown here).

As a result of overstretching and fatigue phenomena caused by dynamic loads acting on the smart card from outside, such an adhesive connection exhibits the formation of tears.

Figure 3:
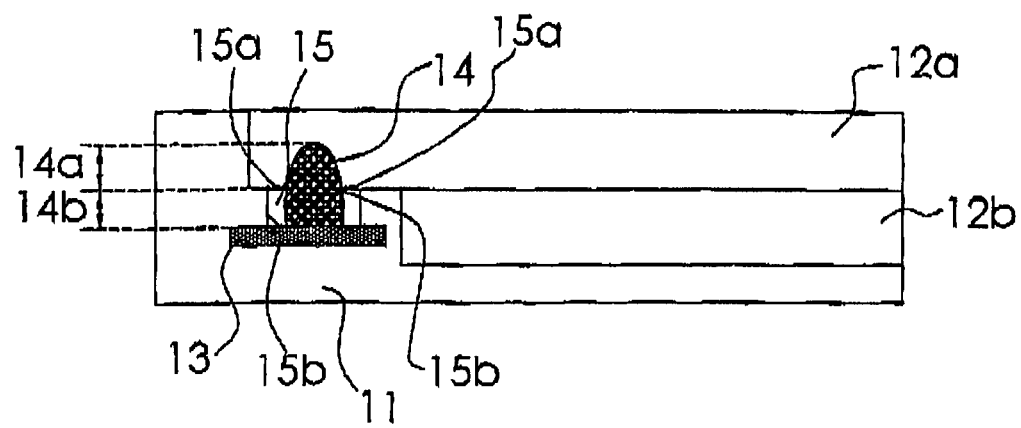
FIG. 3 shows a cross-sectional view of a detail of a smart card according to one embodiment of the invention prior to installation of the chip module.

FIG. 3 shows a cross-sectional view of a detail of half a smart card according to one embodiment of the invention. Two recesses 12a and 12b of different depth for receiving a chip module are arranged in a card body 11. An antenna having an antenna connection 13 is laminated into the card body 11, the antenna connection 13 being arranged below an edge region of the recess 12a.

In a cutout 15 in the card body 11 that is arranged above the antenna connection 13 in the manner of a slit or bore, there is arranged an adhesive part 14 made of elastic, conductive material, which is preferably based on silicone or silicone-like material, having an overall height 14a, 14b. The height fraction 14b corresponds to the height of the cutout 15, that is to say to the distance of the antenna connection 13 from an upper edge region 15a of the cutout 15. The height fraction 14a corresponds to the distance of the upper edge region 15a from the upper edge of the adhesive part 14 and is preferably 0.05-0.15 mm.

Figure 4:
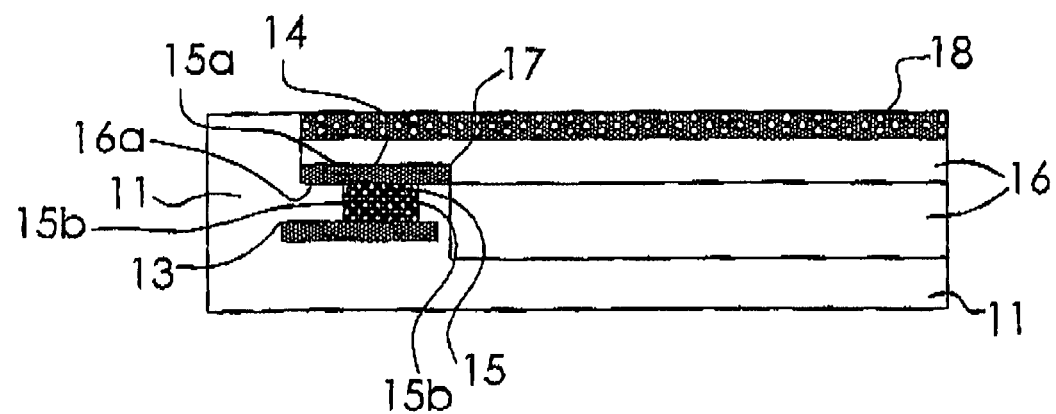
FIG. 4 shows a cross-sectional view of the detail of the smart card according to the embodiment of the invention shown in FIG. 3 following installation of the chip module.

FIG. 4 shows a cross-sectional view of the detail of the smart card shown in FIG. 3, following installation of the smart card. Identical components or components having the same significance are designated by the same references.

Once a chip module having module connections 17 and contact areas 18 on the upper side in the edge region 16a of the chip module 16 has been pressed and thus adhesively bonded onto the card body 11, the adhesive part 14 made of elastic, conductive material is pressed together in the direction of the smart card thickness and pressed onto the two connections 13 and 17 under the application of pressure.

The volume size of the cutout 15 with its upper edge region 15a and its lateral edge regions 15b is dimensioned such that the adhesive part 14 almost fills the entire cutout 15 when the module connection 17 is placed on the upper edge region 15a of the cutout 15, so that yielding of the adhesive part 14 in the lateral direction—that is to say in the longitudinal or width direction of the smart card—is not possible even after many years' use of the smart card. In this way, a permanent electrical contact between the conductive, elastic adhesive part and the module connections 13 and antenna connections 17 is maintained.

The smart card according to the invention that is shown here and the associated production method furthermore have the advantage, compared to smart cards and methods in which hot-melt adhesives are used, that in the event of too many adhesive parts being applied, no lateral emergence and contamination of the card surface is possible during implantation of the chip module, since the adhesive parts are already cured prior to installation of the chip module.

All the features disclosed in the application documents are claimed as being essential features of the invention in that they, individually or in combination, are novel with respect to the prior art.

The invention claimed is:

1. A method of producing smart cards having a card body (11), at least one recess (12a, 12b) arranged therein for receiving at least one chip module (16) having module connections (17) in the edge region (16a) of the chip module (16) and a conductive structure body embedded in the card body (11) and having body contact connections (13), in particular an antenna having antenna connections which are arranged below the edge region (16a) of the chip module (16), characterized in that, prior to installation of the chip module (11), adhesive parts (14) made of elastic, conductive material are applied at points to the body contact connections (13) and/or the module connections (17) and cured, and then the chip module (11) is installed in the card body (11) with pressure being applied to the adhesive parts (14) made of elastic material.

2. The method according to claim 1, characterized in that, prior to installation of the chip module (11), the adhesive parts (14) are applied so as to be about 0.05 to 0.15 mm higher than upper edge regions (15a) of cutouts (15) arranged in the card body, which cutouts are designed to receive the adhesive parts (14).

3. A smart card having a card body (11), at least one recess (12a, 12b) arranged therein for receiving at least one chip module (16) having module connections (17) in the edge region (16a) of the chip module (16) and a conductive structure body embedded in the card body (11) and having body contact connections (13), in particular an antenna having antenna connections which are arranged below the edge region (16a) of the chip module (16), wherein, with the chip module (16) installed between the module connections (17) on the one hand and the body contact connections (13) on the other hand, adhesive parts (14) made of conductive material are arranged between the connections (13, 17) characterized in that the adhesive parts (14) are made of elastic material, are applied at points, are cured prior to installing the chip module (16), with pressure being applied to produce a contact.

4. The smart card according to claim 3, characterized in that the adhesive parts (14) are arranged within cutouts (15) which are arranged in the card body (11) below the edge region (16a) of the chip module (16) and at the bottom terminate with the body contact connections (13).

5. The smart card according to claim 4, characterized in that the cutouts (15) have a volume size that is sufficient to completely receive the adhesive parts (14) under the application of pressure.

6. The smart card according to claim 4, characterized in that in the direction of the card body thickness the cutouts (15) have height dimensions (14b) that are smaller than the height (14, 14b) of the adhesive parts (14) applied at points, without the application of pressure.

7. The smart card according to claim 3, characterized in that the adhesive parts (14) form a resilient buffer in order to produce a permanent contact between the chip module connections (13) and body contact connections (17) following installation of the chip module (11).

8. The smart card according to claim 3, characterized in that the adhesive parts (14) primarily act along the card body thickness as a resilient buffer.

* * * * *

UNITED STATES PATENT AND TRADEMARK OFFICE
CERTIFICATE OF CORRECTION

PATENT NO. : 7,331,528 B2 Page 1 of 1
APPLICATION NO. : 10/537386
DATED : February 19, 2008
INVENTOR(S) : Ried et al.

It is certified that error appears in the above-identified patent and that said Letters Patent is hereby corrected as shown below:

On the Title Page, item (75)

Please change "Michael Reid" to --Michael Ried--

Item (12) Please change "Reid" to --Ried--

Signed and Sealed this

Twenty-seventh Day of May, 2008

JON W. DUDAS
*Director of the United States Patent and Trademark Office*